United States Patent [19]

Chang et al.

[11] Patent Number: 5,610,833
[45] Date of Patent: Mar. 11, 1997

[54] COMPUTER-AIDED DESIGN METHODS AND APPARATUS FOR MULTILEVEL INTERCONNECT TECHNOLOGIES

[75] Inventors: Norman H. Chang, Fremont; Keh-Jeng Chang, Sunnyvale; Keunmyung Lee, Redwood City; Soo-Young Oh, Fremont, all of Calif.

[73] Assignee: Hewlett-Packard Company, Palo Alto, Calif.

[21] Appl. No.: 533,408

[22] Filed: Sep. 25, 1995

Related U.S. Application Data

[63] Continuation of Ser. No. 892,102, Jun. 2, 1992, abandoned.
[51] Int. Cl.$^6$ ................................................. G06F 17/50
[52] U.S. Cl. ........................... 364/491; 364/488; 364/490; 364/578
[58] Field of Search .................................. 364/488–491, 364/578

[56] References Cited

U.S. PATENT DOCUMENTS

| | | | |
|---|---|---|---|
| 4,651,284 | 3/1987 | Watanabe et al. | 364/491 |
| 4,922,432 | 5/1990 | Kobayashi et al. | 364/490 |
| 4,937,827 | 6/1990 | Beck et al. | 371/23 |
| 4,970,664 | 11/1990 | Kaiser et al. | 364/521 |
| 5,019,961 | 5/1991 | Addesso et al. | 364/192 |
| 5,051,938 | 9/1991 | Hyduke | 364/578 |
| 5,121,330 | 6/1992 | Blaha et al. | 364/468 |
| 5,155,836 | 10/1992 | Jordan et al. | 395/500 |
| 5,157,668 | 10/1992 | Buenzli, Jr. et al. | 371/15.1 |
| 5,220,512 | 6/1993 | Watkins et al. | 364/489 |
| 5,222,030 | 6/1993 | Dangelo | 364/489 |
| 5,241,620 | 8/1993 | Ruggiero | 395/22 |
| 5,258,919 | 11/1993 | Yamanouchi et al. | 364/489 |
| 5,272,642 | 12/1993 | Suzuki | 364/474.24 |
| 5,278,769 | 1/1994 | Bair et al. | 364/490 |
| 5,287,284 | 2/1994 | Sugino et al. | 364/468 |
| 5,303,161 | 4/1994 | Burns et al. | 364/490 |

OTHER PUBLICATIONS

J. W. Rozenblit, et al., "Towards a VLSI packaging Design Support Environment (PDSE); Concepts and Implementation", Proceedings IEEE International Conference on Computer Design, Sep. 17, 1990, Cambridge, MA, pp. 443–448.

Keh–Jeng Chang, et al., "HIVE: An Efficient Interconnect Capacitance Extractor to Support Submicron Multilevel Interconnect Designs", IEEE International Conference on Computer-Aided Design, Nov. 11, 1991, Santa Clara, CA, pp. 294–297.

Umakanta Choudhury, et al., "An Analytical–Model Generator for Interconnect Capacitances", Proceedings of the IEEE 1991 Custom Integrated Circuits Conference, May 12, 1991, San Diego, CA, pp. 8.6.1–8.6.4.

Norman H. Chang, et al., "IPDA: Interconnect Performance Design Assistant", 29th ACM/IEEE Design Automation Conference, Anaheim, CA., Jun. 8, 1992, pp. 472–477.

(List continued on next page.)

Primary Examiner—Kevin J. Teska
Assistant Examiner—Leigh Marie Garbowski

[57] ABSTRACT

Data processing methods and computer display systems for computer aided design and electrical performance prediction of multilevel on-chip and off-chip interconnects. The invention specifically relates to parameterized graphical display and computation tools for calculation and display of capacitance and other electrical characteristics of multilevel VLSI, PCB, and MCM interconnects. Four subsystems are integrated: (a) a batch-mode computation module that combines a 2-D/3-D finite difference numerical simulation and a fast interpolation algorithm; (b) an interactive design mode with performance browsing, goal-directed synthesis, and on-line performance evaluation; (c) an interactive SPICE subcircuit generator and simulator; and (d) a spreadsheet-style graphical user interface.

10 Claims, 6 Drawing Sheets

Microfiche Appendix Included
(61 Microfiche, 1 Pages)

OTHER PUBLICATIONS

Goel et al., "PCSIGV: A Student–Oriented Program for Calculating the Parasitic Capacitances for Single–Level Interconnections on GaAs–Based VLSI", IEEE Transactions on Education, vol. 32, No. 3, Aug. 1989, pp. 381–386.

Rozenblit et al., "Computer Aided Design System for VLSI Interconnections," 1989 Int'l Conference of Computer Design, pp. 237–241.

Smith et al., "Cell Libraries and Assembly Tools for A/D CMOS and BiCMOS ASIC Design", IEEE Journal of Solid State Circuits, vol. 24, No. 5, Oct. 1989, pp. 1419–1432.

K–J Chang et al., "HIVE: An Express and Accurate Interconnect Capacitance Extractor for Submicron Multilevel Conductor Systems," VMIC Conference, Jun. 11–12, 1991, pp. 359–363.

S–Y Oh et al., "Physical and Technological Limitations and Their Optimization in Submicron VLSI Interconnect," ICVC Conference, 1991, (no page #s given).

K–J Chang et al., "Parameterized SPICE Subcircuits for Submicron Multilevel Interconnect Modeling", VLSI Symposium, Jun. 2, 1992, (no page #s given).

S–Y Oh et al., "Interconnect Modeling and Design in High–Speed VLSI/VLSI Systems," ICCD Conference, 1992, (no page #s given).

K–J Chang et al., "Parameterized SPICE Subcircuits for Multilevel Interconnect Modeling and Simulation," Dec. 1992, (no further information given).

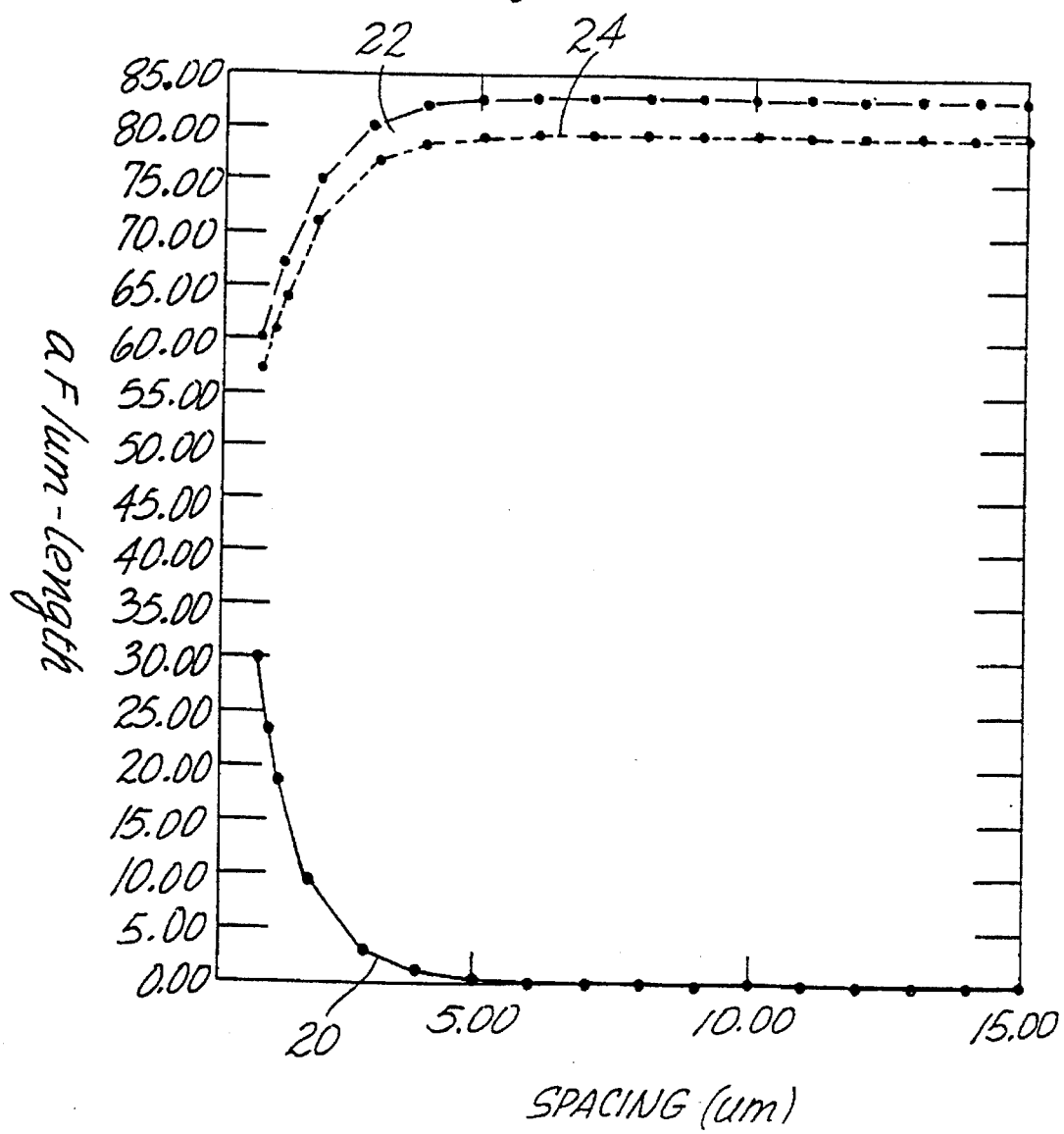

COMPUTER-AIDED DESIGN METHODS AND APPARATUS FOR MULTILEVEL INTERCONNECT TECHNOLOGIES

CROSS REFERENCE TO RELATED APPLICATION(S)

This is a continuation of application Ser. No. 07/892,102 filed on Jun. 2, 1992, now abandoned.

Microfiche Appendix A consists of 1 sheet of 61 frames of microfiche including seven articles appertaining to the subject matter of the present invention.

FIELD OF THE INVENTION

This invention generally relates to data processing methods and computer display systems for computer aided design and electrical performance prediction of multilevel device interconnect technologies. The invention specifically relates to parameterized graphical display and computation tools for calculation and display of capacitance and other electrical characteristics of multilevel VLSI interconnects as well as PCB and MCM interconnects.

BACKGROUND OF THE INVENTION

VLSI integrated circuits ("VLSI chips") are expensive to design, prototype, and test. It is impractical to construct a new VLSI chip simply to test its electrical characteristics or performance. Therefore, VLSI chip designers use computers and computer-aided engineering software to design new VLSI chips, using a high-resolution graphics workstation to display a schematic and physical layout of the VLSI chip. Software is commercially available for simulating electrical performance of complex VLSI chips. This software includes SPICE, originally developed by the University of California, Berkeley as enhanced by HP and described in "HSPICE User's Manual," part number 5955-5528, commercially available from Hewlett-Packard Company, Circuit Technology Group, 5301 Stevens Creek Boulevard, Santa Clara, Calif. 95052 USA. For proper operation SPICE requires input in the form of a SPICE subcircuit data file, known in the art as a "SPICE deck," which numerically describes the location and type of every conductor and component of the VLSI chip. Generation of SPICE decks to describe VLSI circuits is extremely tedious and time-consuming.

One difficult problem faced by VLSI chip designers is design of conductor interconnections between two VLSI chip devices such as transistors. Some conductor interconnects are three-dimensional and follow a non-linear path, since VLSI chips often are constructed with several overlapping layers of metal, polysilicon, and dielectric materials. The electrical characteristics (such as resistance, inductance, and capacitance) of these multilevel interconnects are determined by a complex relationship of numerous physical variables, including metal thickness, insulator thickness, dielectric constant, line width, inter-line spacing, and coupled line length between devices. The relationship between capacitance and interline spacing is non-linear. Also, the variables listed above result in a large number of possible values for resistance, inductance and capacitance depending on the physical size, type, and combination of metals, or insulators selected by the designer.

Accordingly, VLSI circuit designers desire to have a computer system for generating resistance, inductance, and capacitance models for all possible interconnect layout patterns. Since such models for multilevel interconnects require much computation, VLSI circuit designers desire a computer system which can execute such computation in advance in an off-line batch mode.

VLSI chip designers also desire a computer system capable of computing the non-linear relationship of capacitance to interline spacing, given trace width and trace spacing, using polynomial or cubic spline curve fitting and interpolation.

VLSI chip designers further desire a computer system which can quickly generate parameterized SPICE subcircuit data files for interconnects after computing capacitance.

VLSI chip designers also desire a computer system which can interpolate on-chip capacitance values rapidly given the type of integrated circuit ("IC") fabrication process, trace width, and trace spacing, using linear polynomial or cubic spline curve fitting.

VLSI chip designers also desire a computer system which can rapidly generate high-level parameterized SPICE subcircuit and circuit data files based on linear polynomial or cubic spline curve fitting given an IC process, rise time, trace width, trace spacing, and line coupling length.

VLSI chip designers also desire a computer system with an automatically updated spreadsheet display for viewing performance data and for displaying such data in response to variable changes entered by the designer, thereby enabling rapid evaluation of design changes and trade-offs.

When fast clock frequency is used in VLSI chips, transmission line effects will appear on long on-chip interconnects, creating numerous design problems. As is known in the art, signals with 0.5 nanosecond (ns) rise time will incur transmission line effects when the interconnect length is equal to or longer than 3.0 cm. Current VLSI chip die size cannot be dramatically increased due to defect density concerns. Therefore, uniform on-chip interconnect segments to be represented by parameterized subcircuit calls will not approach 3.0 cm for the near future. However, the rise time requirement for full-custom chips will be well below 0.5 nanosecond very soon. Accordingly, VLSI chip designers desire circuit simulators which can import multi-line R, L, C models for lossy, high-density sub-micron interconnect ("SMI") transmission line simulations.

However, the differences between distributed R,C line and transmission line effects indicate that a straightforward extension of conventional R,C line modeling is not enough for on-chip transmission line modeling. Therefore, designers would appreciate a circuit data file generator which can automate the determination of maximum length of each section for on-chip interconnects based on rise time.

To generate SPICE decks, most designers rely on schematic capture programs during pre-layout design and circuit extractors during physical layout. As is known in the art, a SPICE deck is a file of circuit definition data which is fed to the SPICE circuit simulator program. Use of a parameterized model library can relieve designers of all the interconnect modeling and most of the SPICE deck generation effort. Accordingly, designers would appreciate an automated SPICE deck generator for VLSI interconnects which can use parameterized libraries to increase the speed of generating SPICE decks.

Metal materials such as copper, tungsten, or their alloys have been proposed to replace aluminum alloys in some or all metal levels to satisfy future speed, reliability, and manufacturing requirements. Since the metal profiles and resistivities of these proposed metals differ from those of aluminum, interconnect R,C models must be resimulated. Accordingly, circuit designers desire to have a parameterized model library generator to provide accurate and efficient interconnect models for evaluating the impact of material changes on electrical performance.

Signal propagation delays caused by interconnects form a large percentage of total signal delays in VLSI chips. However, for multi-level interconnect technology ("MLIT") modeling in the IC/packaging industry, few CAD tools are available to increase productivity. Three-dimensional structures such as dual signal stripline, via, lead attachments, and trace bends require 3-D numerical simulations for accurate computation of impedance, noise margin and delay. Such simulations are time-consuming and tedious. Therefore, MLIT designers would appreciate accurate and immediate performance information.

High-speed chip designs also demand that engineers consider every combination of technologies from all packaging categories (i.e., IC processes, multilevel interconnect technology ("MCM"), printed circuit boards ("PCB"), via, and lead attachment technologies) to determine which will satisfy chip performance specifications, such as delay and noise margin requirements. A data processing system for interconnect modeling is therefore needed to integrate and optimize chip design and packaging selection.

MLIT designs also require knowledge of material science, electrical engineering, and mechanical engineering. Designers must consider each area of engineering in the search for an optimum design. Therefore, designers would appreciate a data processing system which can assist in evaluating cost-performance trade-offs among all different requirements.

SUMMARY OF THE INVENTION

This invention provides data processing methods and computer display systems for computer aided design and electrical performance prediction of multilevel device interconnects in VLSI integrated circuits, as well as PCB and MCM technologies. The invention specifically relates to parameterized graphical display and computation tools for calculation and display of capacitance and other electrical characteristics of multilevel VLSI interconnects. Four subsystems are integrated: (a) a batch-mode computation module that combines a 2-D/3-D finite difference numerical simulation and a fast interpolation algorithm; (b) an interactive design package with performance browsing, goal-directed synthesis, and on-line performance evaluation; (c) an interactive SPICE subcircuit generator and simulator; and (d) a spreadsheet-style graphical user interface.

First, for completeness and speed, combinations of parameters (e.g. width, spacing) for possible interconnect configurations are numerically simulated or interpolated in a batch mode and are saved into a data file for each MLIT. Batch mode simulation for a new interconnect configuration can be easily set up and run. Results are then automatically added to the existing database.

Second, optimization of an interconnect design is done interactively through goal-directed interconnect synthesis given performance goals, flexible X-Y graphing, and fast on-line performance evaluation for arbitrary layer assignment of an interconnect structure with user-specified risetime, number of coupled traces, temperature, width, spacing, and coupling length.

Third, by using the invention, complete SPICE subcircuit/circuit generation and simulation for an interconnect structure design, including the layer assignment, risetime, width/spacing, and coupling length, can be generated and simulated automatically for signal integrity analysis. Study of the chip-to-chip communication for optimizing driver, interconnect, and receiver design in terms of total delay, noise margin, and other goals can be done more easily and quickly than with other methods.

Thus, the invention provides engineers with access to interconnect models for all MLITs, and makes different levels of packaging design more compatible and eases the task of system interconnect simulation. The invention drastically improves the productivity of circuit designers because accurate interconnect models can be specified easily without time-consuming capacitance simulations. The model library is designed to free chip designers from the details of both interconnect geometry and process variations and provide them with a direct SPICE link. Errors commonly found during manual SPICE deck generations can be reduced significantly. A commercial SPICE circuit simulator can be used without modification.

BRIEF DESCRIPTION OF DRAWINGS

FIGS. 2a, 2b, and 2c are graphs of capacitance versus interline spacing;

DETAILED DESCRIPTION OF PREFERRED EMBODIMENTS

Figure 1A:
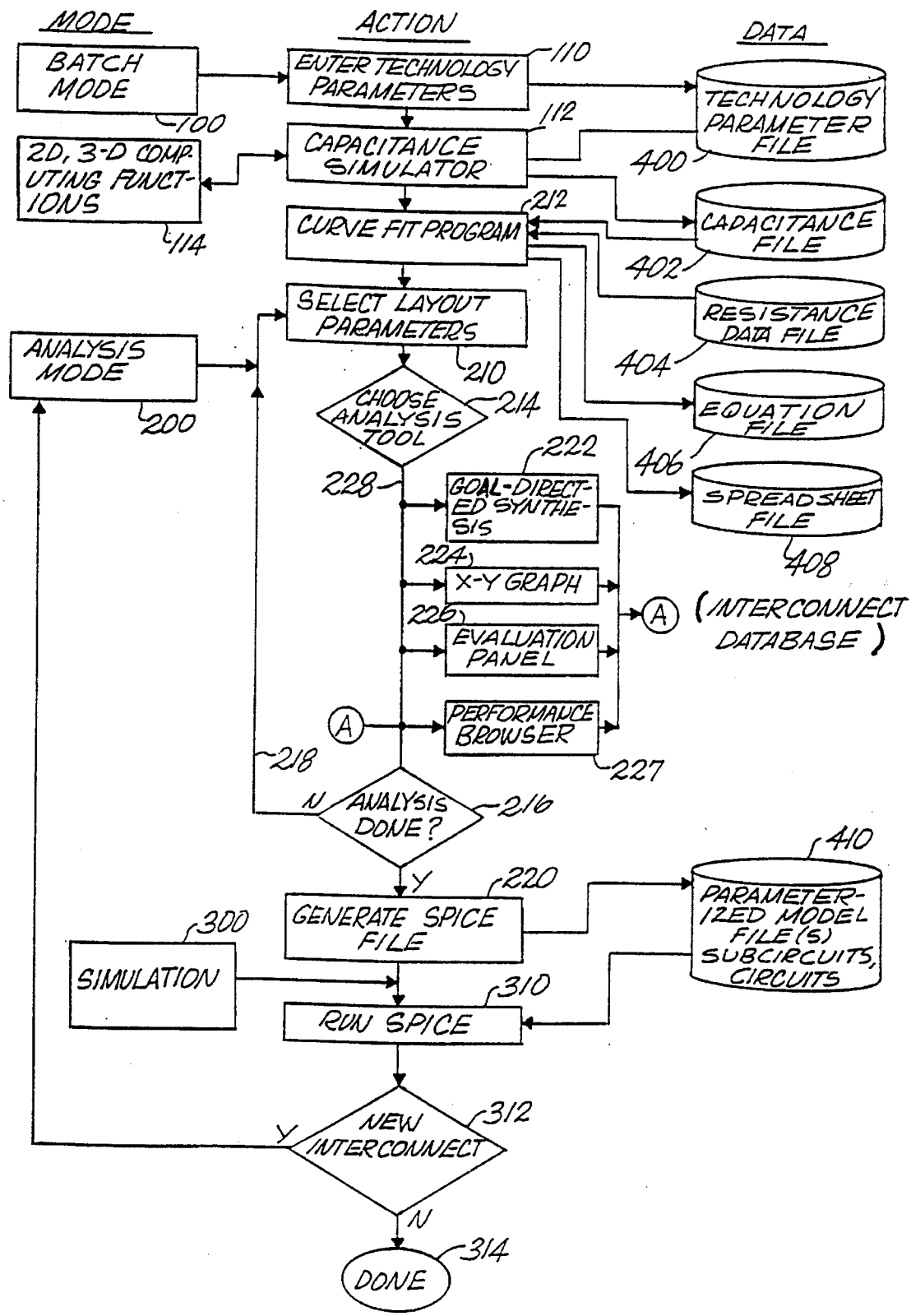
FIG. 1a is a block diagram showing interconnections of a data processing method and data files of the present invention.

This invention improves upon processing methods disclosed in the following papers: (1) K-J Chang et al., "HIVE: An Express and Accurate Interconnect Capacitance Extractor For Submicro Multilevel Conductor Systems," presented at VMIC Conference 11–12 Jun. 1991; (2) K-J Chang et al., "HIVE: An Efficient Interconnect Capacitance Extractor to Support Submicron Multilevel Interconnect Designs," presented at ICCAD, November 1991; and (3) S-Y Oh et al., "Physical and Technological Limitations and Their Optimization in Submicron ULSI Interconnect," presented at the ICVC 1991 conference, Seoul, Korea.

Aspects of this invention are described in the following unpublished papers: (4) Chang et al., "Parameterized SPICE Subcircuits for Submicron Multilevel Interconnect Modeling", scheduled for publication at the VLSI Symposium, Jun. 2, 1992; (5) Chang et al., "IPDA: High-Speed Interconnect Performance Design Assistant", scheduled for publication at the IEEE/ACM DAC, Jun. 7, 1992; (6) Oh et al., "Interconnect Modeling and Design in High-Speed VLSI/ULSI Systems", scheduled for publication as an invited paper at the ICCD in the latter half of 1992; and (7) Chang et al., "Parameterized SPICE Subcircuits for Multilevel Interconnect Modeling and Simulation", expected to be published in December 1992.

All seven of the foregoing papers are attached hereto as an Appendix and are incorporated herein by this reference.

1 Introduction and Overview

The present invention integrates four sets of data processing methods to enable fast computer aided design of complex three-dimensional interconnect structures. In general, the data processing methods receive input of layout parameters and technology parameters identifying the circuit to be designed and generate output data files for the SPICE circuit simulator. The four data processing methods include (a) a batch-mode computation processing method that combines a 2-D/3-D finite difference numerical simulation and a fast interpolation algorithm; (b) an interactive design processing method with performance browsing, goal-directed synthesis, and on-line performance evaluation; (c) an interactive SPICE subcircuit generator and simulator; and (d) a spreadsheet-style graphical user interface.

The invention thus assists users in selecting interconnect technologies for design-for-performance goals and also in optimizing interconnect performance designs for different types of chip packaging. By changing parameters and constants entered into the spreadsheets provided by the invention, designers can customize the operation of the invention for other variables such as reliability, thermal effects, and cost effects.

The batch mode element of the invention can be implemented by programming a general purpose data processor using standard equations in any suitable programming language. The inventors have implemented this element in the C programming language. The spreadsheet elements of the invention can be implemented using any of several commercially available spreadsheet computer programs. The inventors have implemented these elements using the commercially available WINGZ spreadsheet running under control of the UNIX operating system on a Hewlett-Packard workstation.

FIG. 1a shows main operational modes, process elements, and data files of the invention. The invention operates in three modes, batch mode 100, analysis mode 200, and design/simulation mode 300. In FIG. 1a, process steps corresponding to each of the three modes are labeled with reference numerals corresponding to the reference numeral used for each mode.

Operation of the invention can begin either in the batch mode 100 or the analysis mode 200. The batch mode 100 is used to prepare data files for a new VLSI chip, MCM, or PCB construction technique, and therefore is used less frequently. Ordinarily a chip designer uses existing construction techniques and begins with analysis mode 200. Each mode is discussed below.

2 Batch Mode

Batch mode 100 comprises steps 110, 112, 114 and 212 of FIG. 1a. The batch mode has been implemented in a C language computer program.

2.1 Interconnect Parameters

Initially, the program receives VLSI chip manufacturing process parameters entered 110 by a user and stored in technology parameter file 400. Then the program calls a numerical method-based capacitance simulator 112 repeatedly for a plurality of interconnect configurations with two widths and range of inter-line spacings. The resulting numerical capacitance database 402 is called CapFile. In one preferred embodiment of the invention, thirty-three interconnect configurations, listed in Table 1, are embedded in the capacitance simulator ("CapSim") 112 program.

Table 1—Interconnect Configurations

1. M1 lines above Poly under M2
2. M1 lines above Substrate under M2
3. M1 lines above Silicide under M2
4. M1 lines above Poly under M3
5. M1 lines above Substrate under M3
6. M1 lines above Silicide under M3
7. M1 lines above Poly
8. M1 lines above Substrate
9. M1 lines above Silicide
10. M2 lines above sparse M1 and Poly
11. M2 lines above sparse M1 and Substrate
12. M2 lines above M1
13. M2 lines above sparse M1 and Poly under M3
14. M2 lines above sparse M1 and Substrate under M3
15. M2 lines above M1 under M3
16. M2 lines above Poly under M3
17. M2 lines above Substrate under M3
18. M2 lines above Silicide under M3
19. M2 lines above Poly
20. M2 lines above Substrate
21. M2 lines above Silicide
22. M3 lines above sparse M1 and Poly
23. M3 lines above sparse M1 and Substrate
24. M3 lines above sparse M2
25. M3 lines above M1
26. M3 lines above M2
27. M3 lines above Poly
28. M3 lines above Substrate
29. M3 lines above Silicide
30. Poly lines above Substrate under M1
31. Poly lines above Substrate under M2
32. Poly lines above Substrate under M3
33. Poly lines above Substrate One of ordinary skill in the art will recognize the abbreviations in the above table as "M1" for metal 1, "M2" for metal 2, "M3" for metal 3, and "poly" for polysilicon. The above interconnect configurations are for planarized SMI technologies that have three metals and one polysilicon. One of skill in the art will recognize that the twenty configurations can be extended for future SMI technologies having more than three metal levels.

CapFile consists of tables representing two line widths for each of the configurations shown in Table 1. The configurations of Table 1 apply to integrated circuits; other models are used for PCB or MCM. Each table comprises one row for each configuration. Each row corresponds to an interline spacing in microns. A typical table has rows for spacings of 0 microns to 15 microns in 1 micron increments. Each row comprises columns for the interline spacing in microns, the RC constant in ns per cm, total capacitance (Ct), interline capacitance (Ci), ground capacitance between two lines (Cg12), ground capacitance from one line to substrate (Cg1p) and a constant F (2Ci/Ct). Some configurations do not have $C_{g2}$ for lack of an upper metal, e.g., configurations 5 and 6. Substrate is considered as a conductor, so $C_{g1}$ always exists. Computation of table values is described below.

2.2 Curve Fitting Using the Equations

Each row of the CapFile tables is computing using a curve fitting method shown in block 212. The method has been implemented in a C language computer program called CurveFit, which uses the least-square method known in the art to model the capacitance changes between minimum spacing (0 microns) and 15 μm Polynomials of degree six are used to curve-fit the non-linear relationship so that the maximum interpolation error can be within 5%. Cubic spline interpolation can also be used for curve-fitting. The CurveFit program also reads a resistance file 404 which contains the sheet rho data for polysilicon, metal 1, metal 2, and metal 3. The results of CurveFit is an equation file 406 containing curve-fit and linear-fit files, respectively shown in Table 2 and Table 3, with equations for $C_i$, $C_{g1}$, $C_{g2}$, and $R_w$ arranged in SPICE format.

TABLE 2

A Curve Fit File

```
* file-name = curve-fit-m1m2sb
.param wid  min=0.8 max=10
.param i    n0=-0.436957 n1=0.778796 n2=-0.408766 n3=
+           0.0727845 n4=0.00391275 n5=-0.000890772
+           n6=3.32038e-5
+           w0=-p.475644 w1=0/865993 w2=-0.481429 w3=
+           0.100322 w4=-0.00106627 w5=-0.000528231 w6=
+           2.37069e-5
.param g2   n0=32.3302 n1=37.83 n2=-11.5503 n3=1.81954
+           n4=-0.155456 n5=0.00683289 n6=-0.000120965
+           w0=354.143 w1=38.569 w2=-11.8872 w3=1.89499
+           w4=-0.163779 w5=0.00726997 w6=-0.000129721
.param g1   n0=30.197 n1=36.7249 n2=-11.1805 n3=1.75704
+           n4=-0.149826 n5=0.00657539 n6=-0.000116269
+           w0=334.961 w1=37.212 w2=-11.3805 w3=1.80057
+           w4=-0.154565 w5=0.00682105 w6=-0.000121114
.param t    min=25 max=110
.param r    min=69 max=87
.param v
+   cg1=    g1.n0*(s*1e6)**0+g1.n1*(s*1e6)**1+g1.n2*(s*1e6)**
+           2+g1.n3*(s*1e6)**3+g1.n4*(s*1e6)**4+g1.n5*
+           (s*1e6)**5+g1.n6*(s*1e6)**6+(w*1e6-wid.min)/
+           (wid.max-wid.min)*((g1.w0-g1.n0)*(s*1e6)**0+
+           (g1.w1-g1.n1)*(s*1e6)**1+(g1.w2-g1.n2)*
+           (s*1e6)**2+(g1.w3-g1.n3)*(s*1e6)**3+(g1.w4-
+           g1.n4)*(s*1e6)**4+(g1.w5-g1.n5)*(s*1e6)**5+
+           (g1.w6-g1.n6)*(s*1e6)**)
+   cg2=    g2.n0*(s*1e6)**0+g2.n1*(s*1e6)**1+g2.n2*(s*1e6)**
+           2+g2.n3*(s*1e6)**3+g2.n4*(s*1e6)**4+g2.n5*
+           (s*1e6)**5+g2.n6*(s*1e6)**6+(w*1e6-wid.min)/
+           (wid.max-wid.min)*(g2.w0-g2.n0)*(s*1e6)**0+
+           (g2.w1-g2.n1)*(s*1e6)**1+(g2.w2-g2.n2)*
+           (s*1e6)**2+(g2.w3-g2.n3)*(s*1e6)**3+(g2.w4-
+           g2.n4)*(s*1e6)**4+(g2.w5-g2.n5)*(s*1e6)**5+
+           (g2.w6-g2.n6)*(s*1e6)**6)
+   ci =    1/(i.n0*(s*1e6)**0+i.n1*(s*1e6)**1+i.n2*(s*1e6)**
+           2+i.n3*(s*1e6)**3+i.n4*(s*1e6)**4+i.n5*(s1e6)**5+
+           i.n6*(s*1e6)**6)+(w*1e6-wid.min)/(wid.max-
+           wid.min)*
+           (1/(i.w0*(s*1e6)**0+i.w1*(s*1e6)**1+i.w2*
+           (s*1e6)**2+i.w3*(s1e6)**3+i.w4*(s*1e6)**4+i.w5*
+           (s*1e6)**5+i.w6*(s*1e6)**6)-
+           1/(i.n0*(s*1e6)**0+i.n1*(s*1e6)**1+i.n2*(s*1e6)**
+           2+i.n3*(s*1e6)**3+i.n4*(s*1e6)**4+i.n5*(s*1e6)**
+           5+i.n6*(s*1e6)**6))
+   rw=     (r.min+(temp-t.min)/(t.max-t.min)*(r.max-
+           r.min))/w
```

TABLE 3

A Linear-Fit File

```
* file-name = linear-fit-m1m2sb
.param wid  min=0.8 max=10
.param g1   narrow=7.9393e+01+(s*1e6-15)/(50-15)*
+           (7.9421e+01-7.9393e+01)
+           wide=3.8482e+02+(s*1e6-15)/(50-15)*(3.8484e+
+           02-3.8482e+02)
.param g2   narrow=8.2847e+01+(s*1e6-15)/(50-15)*
+           (8.2866e+01-8.2847e+01)
+           wide=4.0543e+02+(s*1e6-15)/(50-15)*(4.0544e+
+           02-4.0542e+02)
.param i    narrow=1.6462e-02+(s*1e6-15)/(50-15)*
+           (1.1095e-03-1.6462e-02)
```

TABLE 3-continued

A Linear-Fit File

```
+           wide=1.8427e-02+(s*1e6-15)/(50-15)*(1.2860e-
+           03-1.8427e-02)
.param t    min=25 max=110
.param r    min=69 max=87
.param v
+   cg1=    g1.narrow+(w*1e6-wid.min)/(wid.max-wid.min)*
+           (g1.wide-g1.narrow)
+   cg2=    g2.narrow+(w*1e6-wid.min)/(wid.max-wid.min)*
+           (g2.wide-g2.narrow)
+   ci=     i.narrow+(w*1e6-wid.min)/(wid.max-wid.min)*
+           (i.wide-i.narrow)
+   rw=     (r.min+(temp-t.min)/(t.max-t.min)*(r.max-
+           r.min))/w
```

If the inter-line spacing is narrower than 15 μm, curve-fit files are used. If the inter-line spacing is wider than 15 μm, linear-fit files are used. Since each configuration in Table 1 has one curve-fit file and one linear-fit file, the resulting equation file 406 preferably has sixty-six such files. High-density VLSI designers may use curve-fit files most of the time since $C_1$, $C_{g1}$, and $C_{g2}$ do not change much after the spacing is wider than 15 μm.

2.3 Capacitance Calculations for the Tables

Since several VLSI technologies use multiple conductors with different thickness and multiple insulators with different dielectric constants, those of skill in the art prefer numerical method-based capacitance simulators for accurate modeling of VLSI interconnect capacitance. Empirically derived equations having multiple parameters, such as line width, inter-line spacing, conductor thickness and dielectric thickness are known in the art for interconnect modeling. Such equations cannot cover VLSI chip layout configurations with multiple dielectrics and various metal thickness. Furthermore, the ranges of line width and inter-line spacing that can be applied to the multi-parameter equations are limited.

Figure 3:
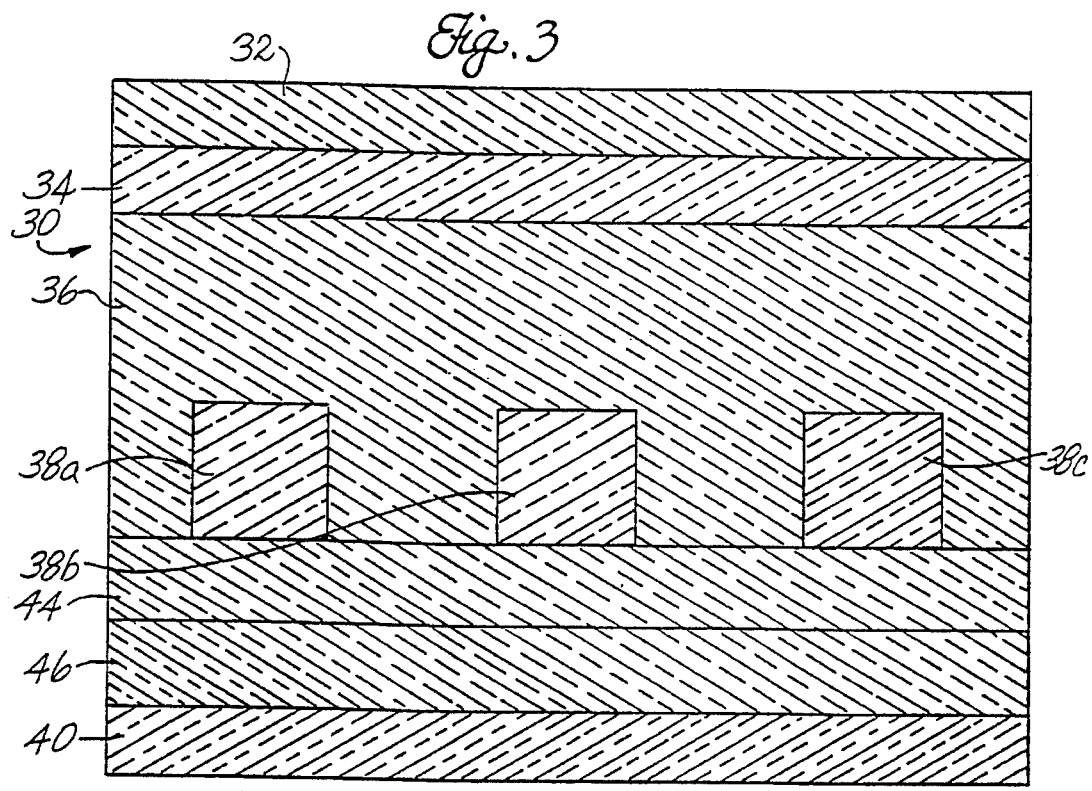
FIG. 3 is a cross-section view of a three-line stripline-type multilevel VLSI interconnect.

FIG. 3 is a schematic cross section of an exemplary VLSI chip section 30 constructed with Metal 1 arrays under a Metal 2 plane above Substrate. A low-temperature oxide layer 36 (TEOS, $\epsilon_r$=4.1) exists between metal 2 (reference numeral 34) and a plurality of conductor lines 38a, 38b, 38c comprising metal 1. Insulators between metal 1 and substrate 40 include phosilicate glass 44 (PSG, $\epsilon_r$=4.0) and field oxide 46 (FOX, $\epsilon_r$=3.9). An insulation layer 32 covers the metal 2 layer 34. Three capacitance relationships exist related to the center metal 1 line 38b. Two ground capacitances ($C_{g1}$ and $C_{g2}$) are developed between line 38b and metal 2 and the substrate, respectively. A one-sided inter-metal-1-line capacitance ($C_i$) is developed between line 38b and either of lines 38a, 38c. If there is no metal 2 (34) above the metal lines 38a, 38b, 38c, then no ground capacitance exists.

The relation of the three capacitance components and the commonly used total capacitance ($C_t$) is expressed in Equation 1:

$$C_t(aF/\mu m)=2 \times C_i+C_{g1}+C_{g2}$$

The units of $C_i$, $C_{g1}$, and $C_{g2}$ are farads per micron (F//μm). In the known art, $C_t$ is calculated and then sectioned for distributed single-line R,C circuit simulation. It is valid when the two adjacent lines 38b, 38c remain in a quiet state. Due to electrical coupling in high-density interconnects, non-switching and long interconnect lines adjacent to an active line often are not quiet. The effective RC-delay, and cross-talk must be simulated with distributed multi-line R,C models. On the other hand, interconnects on different levels are required by design to run in perpendicular directions, so the coupling between different levels is small. Non-active conductor levels, e.g., power supplies, are considered as quiet.

Figure 2A:
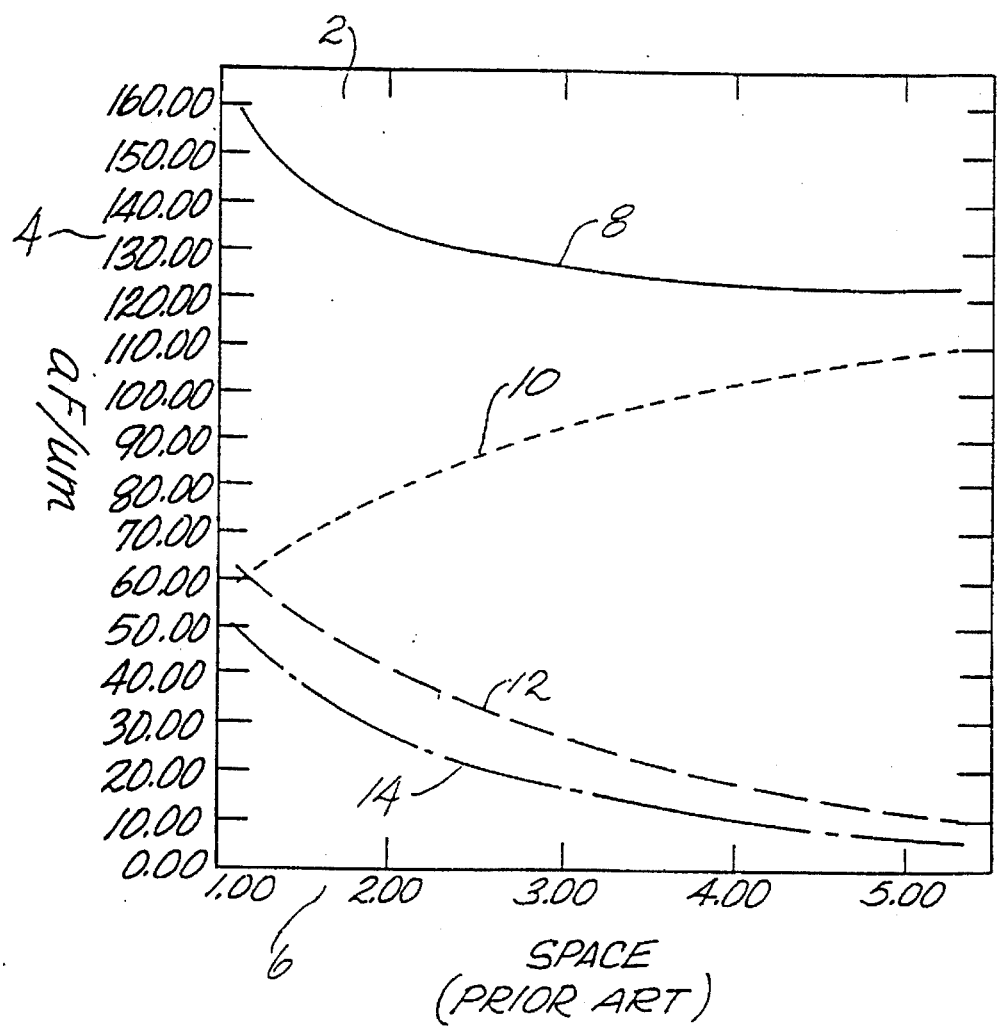

A particular chip technology for VLSI design is affected by three layout parameters (line width, line length, and inter-line spacing of an interconnect line), and technology parameters (such as conductor thickness, dielectric thickness, dielectric constants, and tolerance values). The layout parameters are user-adjustable but the technology parameters are fixed and cannot be changed by designers. During VLSI layout, the values of $C_i$, $C_{g1}$, and $C_{g2}$ are affected by the three layout parameters. The inter-line spacing affects the capacitance in a non-linear manner. FIG. 2a contains a graph 2 showing the non-linear relationship of interline spacing to capacitance. Line width is fixed at 0.9 microns and the construction is M1 arrays above substrate. Vertical scale 4 indicates a-farads per micron. Horizontal scale 6 indicates interline spacing from 1 to 5 microns. Line 8 represents total capacitance, line 10 indicates interline capacitance, line 12 is ground capacitance, and line 14 roughly indicates crosstalk noise. FIG. 2c illustrates the non-linear capacitance relationship versus spacing, when metal 1 line width is fixed at 0.8 μm while the spacing is changed from 1.0 μm to 50 μm. Line 20 represents interline Ci, line 22 represents Cg1, and line 24 represents Cg2. The same phenomena can be found in other conductor levels such as polysilicon, metal 2, and metal 3.

Since capacitance is non-linear in relation to inter-line spacing but linear in relation to line width and line length, polynomials can be used to model capacitance as function of inter-line spacing, as shown below:

$$C_{width}(s)(aF/\mu m) = \sum_{i=0}^{6} a_i \times s^i$$

The $C_{width}(s)$ is capacitance per unit length simulated with a fixed line width and s is a variable representing the inter-line spacing. A least-square method known in the art can be used to curve-fit the non-linearity and generate coefficients for the above polynomial of degree six. The three capacitance curves, $C_i$, $C_{g1}$, $C_{g2}$ in FIG. 2c, are modeled as three polynomials: $C_{imin}(s)$, $C_{g1min}(s)$, and $C_{g2min}(s)$, where min stands for the minimum width specified by the design rule. A reasonably wide width of 10 μm is chosen for polysilicon, metal 1, and metal 2; 20 μm is chosen for metal 3. The coefficients of the six polynomials are embedded in a SPICE-format file shown in Tables 2 and 3.

Interconnect line width affects capacitance of a line in a linear manner, so the capacitances can be modeled in the form of the following three equations:

$$C_i(w,s)(aF/\mu m) = C_{i_{min}}min(s)+(w-wid_{min})/(wid_{max}-wid_{min})\times(C_{i_{min}}(S))$$

$$C_{g1}(w,s)(aF/\mu m) = C_{g1_{min}}(s)+(w-wid_{min})/(wid_{max}-wid_{min})\times(C_{g1_{max}}(s)-C_{g1_{min}}(s))$$

$$C_{g2}(w,s)(aF/\mu m) = C_{g2_{min}}(s)+w-wid_{min})/(wid_{max}-wid_{min})\times(C_{g2_{min}}(s))$$

In these equations, $wid_{min}$ is the minimum width and $wid_{max}$ is the reasonably wide width; w(in μm) is the line width variable. The $C_i(w,s)$, $C_{g1}(w,s)$ and $C_{g2}(w,s)$ above are to be multiplied by the length parameter inside the SPICE subcircuits. In this way, interconnect capacitances are parameterized with layout parameters for a selected technology.

Changes in line resistance are linearly proportional to the temperature, the line length, and the inverse of the line width, so the resistance per unit length can be calculated by:

$$Rw(W)(m\Omega/\mu m)=(R_{min}+(Temp-T_{min})/(T_{max}-T_{min})\times(R_{max}-R_{min}))/w (6)$$

where $R_w$ is wire resistance per micron length, w (in μm) is the line width variable, $T_{min}$ is the minimum temperature, $R_{min}$ is the sheet rho (mΩ/□) at $T_{min}$, $T_{max}$, and temp is the operating temperature of the chip. Temp is also a parameter but it is a global variable in SPICE and need not be specified for each interconnect segment. The $R_w$ above is to be multiplied by the length parameter inside the SPICE subcircuit as well.

Since $C_i$, $C_{g1}$, $C_{g2}$, and $R_w$ can be polynomial-fitted as functions of interconnect dimension, their distributed R,C effects are modeled by a three-line π3 R,C circuit model known in the art, and consists of three cascaded π R,C models to represent a distributed single-line interconnect for circuit simulation. Considering the increased coupling among submicron interconnects, we extend the single-line π3 model to a three-line π3 model for accurate SMI RC-delay and cross-talk simulation.

2.4 Interfacing Models to SPICE

Figure 4:
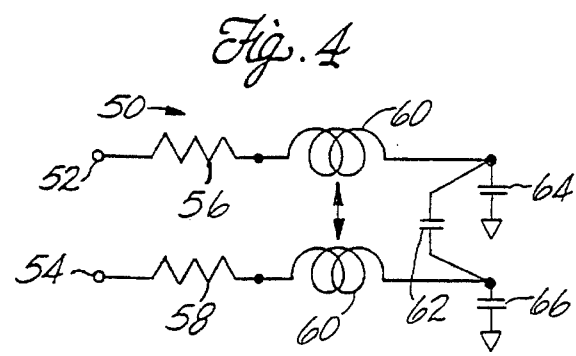
FIG. 4 is a schematic diagram showing resistance, capacitance, and inductance relationships of the materials shown in FIG. 3.

The electrical characteristics of VLSI interconnects are simulated using SPICE by creating a SPICE subcircuit representation of each interconnect. FIG. 4 is a schematic representation of electrical characteristics of two lines of the interconnect of FIG. 3. The interconnect 50 of FIG. 4 has two input points 52, 54 which correspond to terminals of lines 38b, 38c of FIG. 3. Each line 38b, 38c has an impedance represented respectively by resistors 56, 58. Inductance of the two lines 38b, 38c is shown by inductors 60. Capacitor 62 interconnects the lines and represents the interline capacitance of FIG. 3. Ground capacitances are respectively represented by capacitors 64, 66.

A SPICE subcircuit call statement specifying two lines, 1.0-cm-long metal 1 arrays, line width of 4 μm and inter-line spacing of 2 μm would appear as follows:

| X1 | %in1 | %in | %in2 | %out1 | %out | %out2 | 0 | m1m2sb | (4u 2u 1000u) |

Xi is the name of the metal 1 arrays to be modeled. A three-line model requires seven external node names specified to connect the three inputs, three outputs, and ground to adjacent circuits. After the node name specification, the above call statement specifies the subcircuit being called, m1m2sb, and the three layout parameters, width, spacing, and length (inside the parentheses). "m1m2sb" is the acronym for "Metal 1 arrays under Metal 2 above Substrate." For 2.0-cm-long metal 1 arrays, the specification is:

| | | | | | | | | |
|---|---|---|---|---|---|---|---|---|
| X2 | %in1 | %in | %in2 | %out1 | %out | %out2 | 0 | m1m2sb (4u 2u 20000u) |

The following specification will give better accuracy, however, because the number of sections is increased from three to six:

| | | | | | | | | |
|---|---|---|---|---|---|---|---|---|
| X21 | %in1 | %in | %in2 | %tmp1 | %tmp | %tmp2 | 0 | mim2sb (4u 2u 10000u) |
| X22 | %tmp1 | %tmp | %tmp2 | %out1 | %out | %out2 | 0 | mim2sb (4u 2u 10000u) |

With more sections, the total number of nodes to be processed by SPICE will be increased and the execution time will be longer. For on-chip transmission line modeling, the length of each subcircuit call statement should be determined by the rise time.

The batch-mode computation algorithm is derived from the HIVE algorithm disclosed by the authors in the above-identified papers, which computes selective lateral and vertical capacitances of sub-micron IC interconnects using finite-difference methods. The non-calculated capacitances can then be obtained through fast interpolation. The assumptions for extracting submicron on-chip interconnect capacitances reported in the above papers are also valid for MCM and PCB. To be specific, first, interline ("Ci1") and vertical ("Cg") capacitances linearly vary with trace width when the interline spacing is fixed. Second, with enough points for numerical simulation of capacitances in which interline spacing is varying and width fixed, other capacitances for any spacings bounded by the simulated spacings can be interpolated. Capacitance values can be computed using the FCAP2 and FCAP3 algorithms which are known in the art and available in commercial C language libraries for numerical simulation.

For example, the changes of both "Ci1" and "Cg" of a stripline for a thin-film MCM behave linearly when the width is changed but the spacing is fixed. Therefore, for a fixed spacing, only two capacitances need be calculated using numerical simulation; capacitance values for different widths can be interpolated. However, due to the slight non-linearity of capacitance curves versus spacing when the width is fixed as shown in FIG. 2c, more points are needed using numerical simulation. This permits use of linear polynomial or cubic spline interpolation for different spacings depending on the accuracy desired. In either way, the interpolated capacitances are carefully checked to ensure that the maximal induced error is around 3% of the capacitance.

3 Analysis Mode 200

Analysis mode 200 comprises steps 210, 214, 216, 218 and 220 of FIG. 1a. The mode can be implemented by programming a spreadsheet to display a menu tree and a spreadsheet worksheet having a plurality of rows and columns, so that each row comprises a plurality of cells for text or numeric information. Any general purpose spreadsheet can be used but in a preferred embodiment, the WINGZ spreadsheet is used, which is commercially available from Informix Software, Inc., Sales & Information, 913-599-7100. One of skill in the art will recognize that the invention could also be implemented using a general purpose relational database system. Preferably the spreadsheet is programmed to present the user with a plurality of menu choices organized as shown in Table 4. Each menu option is discussed separately below.

TABLE 4

Spreadsheet Menu Choices

Figure 1B:
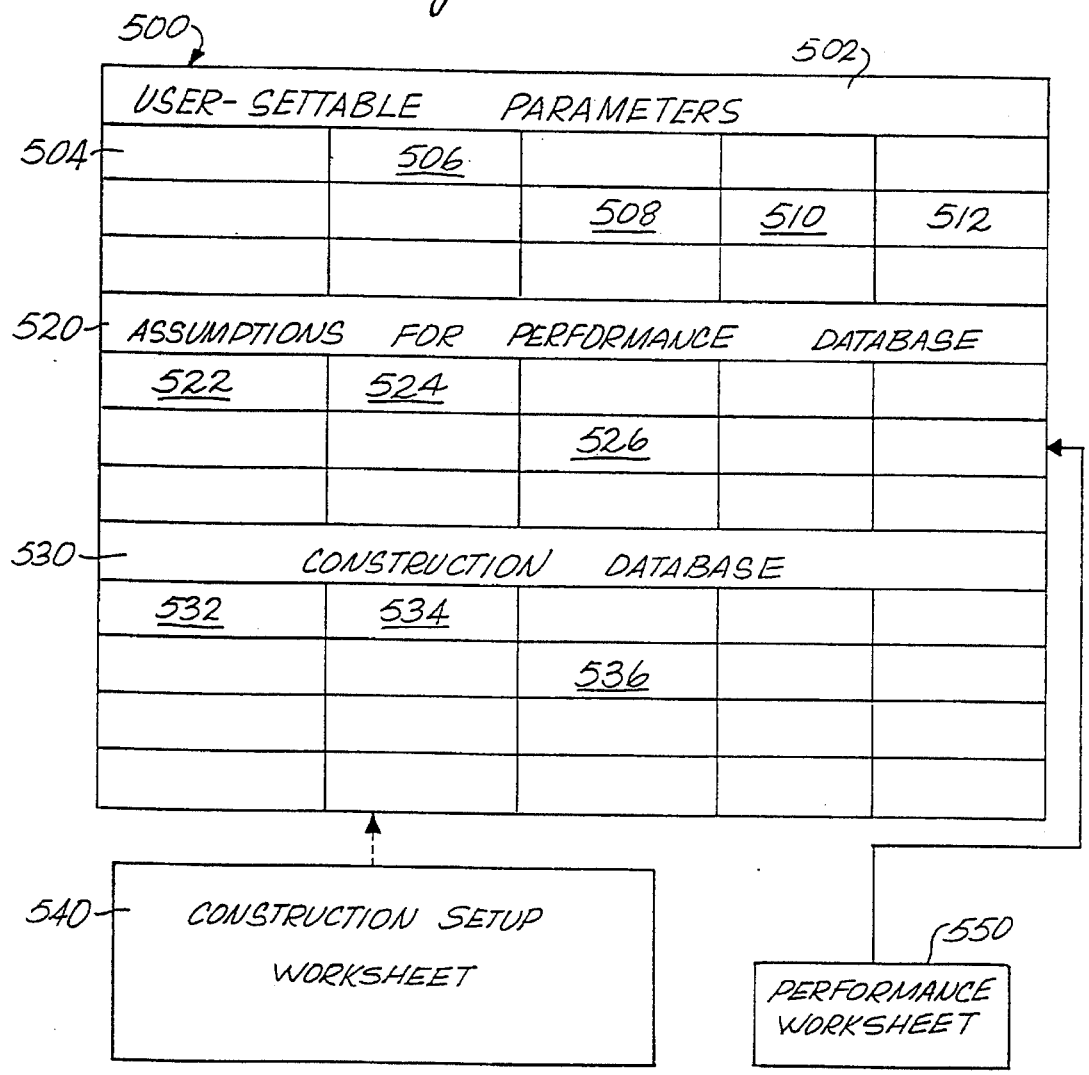
FIG. 1b is a block diagram of spreadsheet displays generated by the present invention.

Performance
.. Performance Browse or Create
.. Database
... Delete database for a construction
... Check existing models
... Generate all traces database
... Generate chosen trace database
.. Plot
... width
... spacing
... width with spacing contour
... spacing with width contour
.. Synthesis
... Synthesis Setup
... Goal-Directed Synthesis
Evaluation
.. Evaluation Setup
.. Model Evaluation
.. Performance Evaluation
SPICE
.. SPICE Setup
.. SPICE Create
Window (moves among windows on workstation screen)
Menu
.. Main Menu
.. Restart FIG. 1b shows a compressed representation of a main spreadsheet 500 of the invention. The main spreadsheet 500 is divided into a user parameter worksheet 502, a performance assumptions worksheet 520, and a construction database worksheet 530. A separate construction setup worksheet 540 is coupled to the construction database worksheet 530. Each of the worksheets comprises a plurality of inter-related cells. As is known in the art, each cell can be programmed with a numeric formula so that a change to one cell results in rapid calculation and redisplay of related cells. One of skill in the art will recognize that the cells and worksheets can be represented in a conventional computer memory or using a relational database system. Preferably the worksheets are stored on a conventional mass storage device, such as a hard disk drive, to enable long-term storage of the data therein.

The user parameter worksheet 502 preferably comprises a plurality of rows 504 each having cells 506, 508, 510, and 512 for entry of text or numeric data. In a preferred embodiment of the invention, the worksheet 502 has three rows 504. The first row accepts user entry of a line width range in microns, such as 10 microns, 20 microns, etc. The second row accepts user entry of a line spacing range in microns, such as 40 microns, 50 microns, etc. The third line displays available metallization models which are abbreviated by acronym known in the art, such as SM, BMO, SL, DSS, etc. Thus, using the user parameter worksheet, a user can enter preferred interconnect line width and spacing for use by other elements of the invention.

Preferably the assumptions worksheet 520 has a plurality of cells 522, 524, 526 for display and entry of technology parameters relating to the chip under development. Preferably, the assumptions worksheet cells include cells for entry or display of signal rise time in ns, chip operating temperature in centigrade, coupled length in inches or centimeters, and a plurality of columns for entry or display of soldermask data. Each soldermask column comprises a plurality of cells in the column for entry or display of soldermask name, soldermask thickness in microns, soldermask dielectric coefficient, metallization type (such as copper or aluminum), and metal resistivity in ohms per meter.

Preferably the construction worksheet 530 comprises a plurality of spreadsheet cells 532, 534, 536 containing data relating to electrical and physical characteristics of different parameters of a particular chip construction. Each row of the construction worksheet 530 contains all parameters relating to one particular construction type. Each column identifies a parameter. Table 5 lists preferred data types and units for each column.

TABLE 5

Construction Worksheet Columns

| Column | Data Type | Units |
|---|---|---|
| 1 | construction type | acronym |
| 2 | layers | integer |
| 3 | dielectric constant | |
| 4 | core | microns |
| 5 | prepreg | microns |
| 6 | outer layer metal | microns |
| 7 | inner layer metal | microns |
| 8 | metal resistivity | ohms/meter |
| 9 | metal overplate thickness | mils |
| 10 | mask dielectric constant | |
| 11 | mask thickness | microns |
| 12 | in database | boolean y/n |

Coupled to the assumptions worksheet 520 is a separate performance database worksheet 550. Preferably the performance worksheet 550 comprises a plurality of rows, each having a plurality of column cells representing electrical performance characteristics of a particular construction for a particular number of traces, trace width, and trace spacing. The performance worksheet is activated by selecting the PERF BROWSE option, which causes the data processor to load and display a performance worksheet. Table 6 lists preferred data types for each column of a row, including units and spreadsheet formulas by which the column cells are computed, for a five-line model. As indicated, the performance worksheet contains performance values computed according to all the other entered data.

TABLE 6

Performance Worksheet Data Types

| Column | Name | Units or Formula |
|---|---|---|
| 1 | type | text |
| 2 | layers | integer |
| 3 | model type | acronym |
| 4 | reserved | |
| 5 | reserved | |
| 6 | number of traces | integer |
| 7 | trace width | mils |
| 8 | trace spacing | mils |
| 9 | effective impedance | ohms |
| 10 | effective PD | ps/inch |
| 11 | latB crosstalk | mV/V |
| 12 | latF crosstalk | mV/V |
| 13 | vertical crosstalk | mV/V |
| 14 | coupling coefficient | (Ze–Zo)(Ze+Zo) |
| 15 | resistivity | ohms/meter |
| 16 | even impedance | ohms |
| 17 | odd impedance | ohms |
| 18 | PD even | ps/inch |
| 19 | PD odd | ps/inch |
| 20 | inductance 1-2 | L12/sqrt(L11*L22) |
| 21 | inductance 1-3 | L13/sqrt(L11*L33) |
| 22 | inductance 1-4 | L14/sqrt(L11*L44) |
| 23 | inductance 1-5 | L15/sqrt(L11*L55) |
| 24 | inductance 2-3 | L23/sqrt(L22*L33) |
| 25 | inductance 2-4 | L24/sqrt(L22*L44) |
| 26 | inductance 2-5 | L25/sqrt(L22*L55) |
| 27 | inductance 3-4 | L34/sqrt(L33*L44) |
| 28 | inductance 3-5 | L35/sqrt(L33*L55) |
| 29 | inductance 4-5 | L45/sqrt(L44*L55) |
| 30 | capacitance 1-1 | farads/meter |
| 31 | capacitance 2-2 | farads/meter |
| 32 | capacitance 3-3 | farads/meter |
| 33 | capacitance 4-4 | farads/meter |
| 34 | capacitance 5-5 | farads/meter |
| 35 | capacitance 1-2 | farads/meter |
| 36 | capacitance 1-3 | farads/meter |
| 37 | capacitance 1-4 | farads/meter |
| 38 | capacitance 1-5 | farads/meter |
| 39 | capacitance 2-3 | farads/meter |
| 40 | capacitance 2-4 | farads/meter |
| 41 | capacitance 2-5 | farads/meter |
| 42 | capacitance 3-4 | farads/meter |
| 43 | capacitance 3-5 | farads/meter |
| 44 | capacitance 4-5 | farads/meter |
| 45–54 | capacitance of each line to planes 1 and 2 | farads/meter |
| 55 | capacitance plane to plane | farads/meter |
| 56–70 | capacitance of each line to substrate | farads/meter |
| 71–85 | inductance of each line to each other line | henries/meter |

Thus, each interconnect construction is specified with a common set of characteristic parameters, such as number of layers, dielectric constants, dielectric thicknesses, conductor type, soldermask or overcoat dielectric constant and thickness, outer layer and inner layer conductor thicknesses, and number of coupling traces. Since different interconnect domains have different sets of characteristic parameters, in the preferred embodiment three separate construction worksheets are maintained for IC, MCM thin film, and PCB/MCm thick film constructions.

The performance worksheet contains representative data points for interconnect capacitances which are extracted numerically for all the conceivable models of a new construction in the batch mode. For example, a 4-layer MCM construction can have models such as stripline (SL), dual stripline (DSS), surface microstrip (SM), and buried microstrip outer (BMO). A linear interpolation algorithm can then be applied to generate any other points bounded by the width/spacing ranges of the simulated points. The simulated capacitances are subsequently used to derive inductances L and transmission line properties, including $Z_o$, $Z_c$, $Z_{eff}$ (odd, even, effective mode impedances); $Pd_o$, $Pd_e$, $Pd_{eff}$ (odd, even, effective propagation delays) [11]; and $V_B$, $V_F$ (backward, forward crosstalks) for all the interconnect models. The formulas used for these derivations are known the art and are discussed in papers [12] and [13] identified below.

4 Interactive Design Functions (Goal Directed Synthesis and Evaluation Panel)

Goal-directed interconnect synthesis helps users to narrow down possible interconnect designs quickly. The domain of search is all processes/technologies that have been simulated in the batch mode. The invention extracts a subset of designs that satisfy multiple performance goals, such as impedance and noise margin, specified by the user.

The user can also look at the effect of changing trace width/spacing on any performance variable by using the graphing facility of the invention discussed below. This is done by showing any performance variable versus trace width and/or trace spacing. An arbitrary number of graphs can be generated, so a user can simultaneously visualize trade-offs for different trace width/spacing designs as well as their impact on several performance variables.

To accomplish goal-directed synthesis, the user selects SYNTHESIS from the spreadsheet menu tree. The SYNTHESIS SETUP option is selected, causing the data processor to display a setup window on the workstation. Preferably the setup window is a spreadsheet worksheet comprising five columns entitled PARAMETER, UNIT, RELATIONSHIP, MINIMUM VALUE, MAXIMUM VALUE, and INPUT. Preferably the worksheet has ten rows identified with names in the PARAMETER column. The rows represent model name, layers in the interconnect, trace width (mils), trace spacing (mils), impedance (Ohms), signal propagation delay (picoseconds/inch), noise margin (mV/V), lateral crosstalk (mV/V), vertical crosstalk (mV/V), and coupling coefficient. The parenthesized unit identifiers are depicted in the UNITS column. In the RELATIONSHIP column the data processor displays reference text such as noise margin data. The worksheet accepts user entry in the MINIMUM VALUE and MAXIMUM VALUE columns. Synthesis setup is then complete.

Next, the user selects the GOAL-DIRECTED SYNTHESIS option from the spreadsheet menu. In response, the data processor displays a window of performance data for constructions meeting the criteria specified in the setup window. The displayed data is selected from the performance data worksheet 550 by comparing values therein with MINIMUM VALUE and MAXIMUM VALUE entries provided by the user.

An evaluation panel is provided for users to do stackup design. Stackup design involves assigning signal or reference planes to each layer of an interconnect construction. Once a user specifies layer assignment for a selected construction, the invention can determine layer models for each layer. Furthermore, on-line performance evaluation can be done for each signal layer given an arbitrary trace width and spacing within the interpolation range.

Evaluation is initiated by selecting the EVALUATION SETUP spreadsheet option from the menu. In response, the data processor displays a spreadsheet worksheet containing a plurality of layer rows, each row corresponding to a layer of the construction type under analysis. The worksheet further includes a plurality of layer cells in each row corresponding to different parameters which characterize each layer. Preferably, the layer cells permit entry of data for layer type (soldermask or active layer), layer assignment (mask, signal, blank signal, or reference), and layer model (surface microstrip, stripline, etc.). When these values are entered, evaluation setup is complete.

Next, the user selects MODEL EVALUATION. In response, the data processor computes and fills in data for each cell of the performance worksheet, identified above in Table 6. Thus, by choosing a specific signal layer from the evaluation worksheet, the user can generate and simulate SPICE subcircuits through the interactive SPICE setup worksheet and SPICE window and thereby evaluate performance of different layers.

5 SPICE Subcircuit Generator

If the test of step 216 is true, control is passed to step 220 in which the invention will generate a SPICE deck or file for the interconnect being analyzed. Passage of control to step 220 is usually accomplished by the user moving the mouse of the workstation to the SPICE spreadsheet menu option. In response, the data processor displays two sub-options: SPICE SETUP and SPICE CREATE.

When the user selects SPICE SETUP, the data processor displays a SPICE SETUP spreadsheet worksheet. The worksheet displays setup conditions for SPICE simulation of coupling of specified traces. Traces can be specified as active or inactive, where active means connecting the input of the trace to a pulse that has a user-specified rise time. The user can specify the termination of a trace by providing a characteristic impedance in ohms or by specifying open termination. Preferably a first area of the worksheet contains cells for input of a default characteristic impedance, and for rise time, pulse width, and period of active trace input signals. A second area of the SPICE SETUP worksheet contains a plurality of rows, each row corresponding to an interconnect trace. Each trace row comprises a plurality of cells to store data representing the trace number, whether the trace is active or inactive, input impedance, whether ground is present, names of input and output nodes connected by the interconnect, and a characteristic termination impedance. Each cell is filled by the user with numeric data for use by the SPICE CREATE option.

When the user selects SPICE CREATE, in step 220, the method of the invention causes a data processor to read the equation file 406 and generate parameterized three-line $\pi 3$ circuit models for distributed R,C circuit simulation. The resulting SPICE deck is written to a parameterized model file 420.

To form the SPICE deck, $C_{g1}$, and $C_{g2}$ read from the equation file are added to form $C_g$. Then $C_g$, $C_i$, and $R_w$ are multiplied by the line length of the interconnect and divided by three, respectively, to become three separate circuit elements. The capacitances on the boundary must be further divided by two. For each configuration in Table 1, a curve-fit R,C file and a linear-fit R,C file is generated. The resulting parameterized model library has forty distributed R,C SPICE subcircuits. The parameters for each subcircuit are line width, inter-line spacing, and line length. Chip operating temperature is also a parameter but it can be accessed in a global manner and need not be specified in each subcircuit call statement.

After creation of a SPICE deck, the user can activate the SPICE program using a separate workstation window, and specify the just-created SPICE deck as input. All known and ordinary SPICE functions can be executed.

6 Plotting Graphs

Once the performance database is built, the user can use the invention's performance browser and graphics capability to look at different curves of interest. To plot a graph, the user first moves the workstation cursor to any single cell in the performance worksheet. Then the user selects the PERFORMANCE PLOT option from the spreadsheet menu.

Four options called WIDTH, SPACING, WIDTH WITH SPACING CONTOUR, and SPACING WITH WIDTH CONTOUR are available to plot capacitance versus trace width or trace spacing. The selected option generates a graph based on the data in the previously selected cell. Graphs are generated using the public-domain XGRAPH program developed by U. C. Berkeley.

Figure 2B:
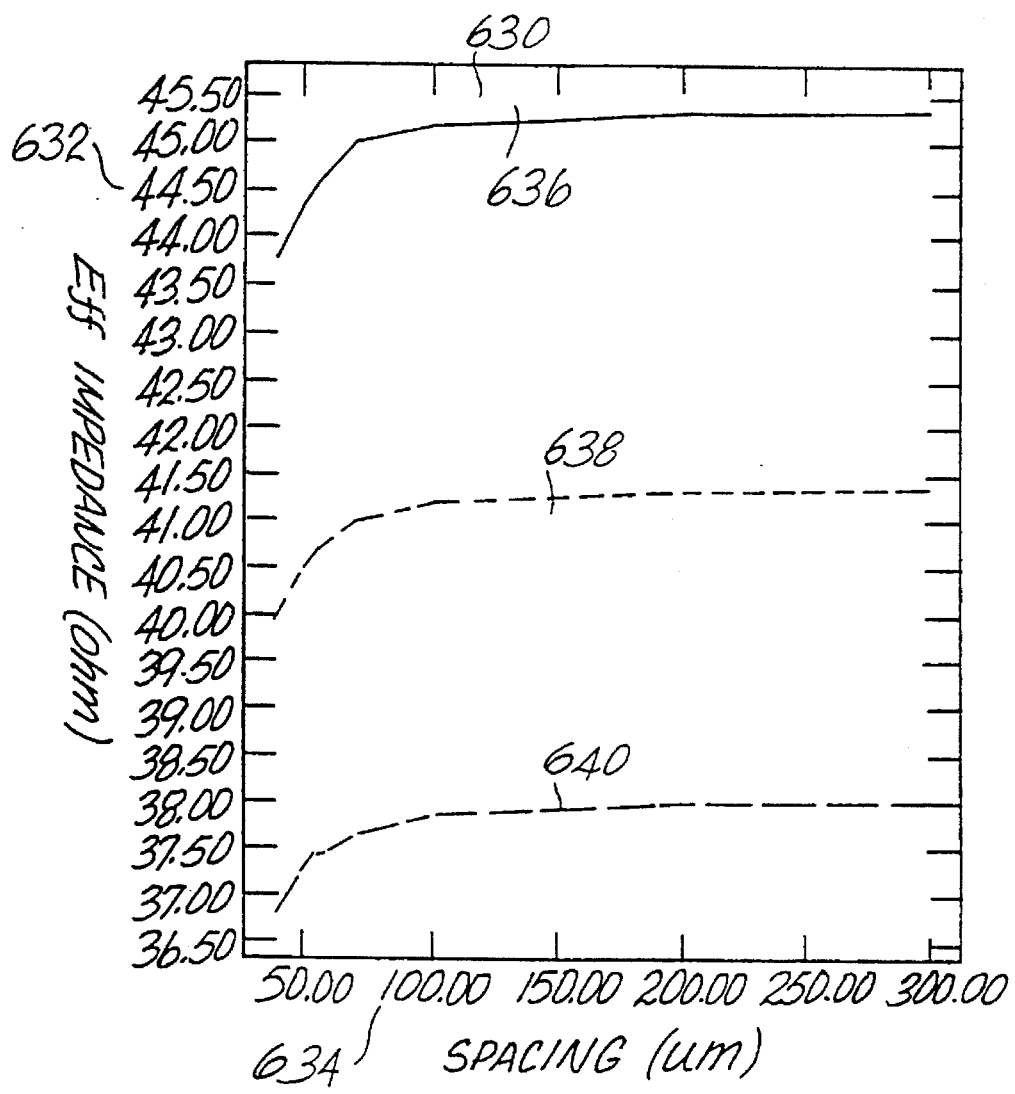

FIG. 2b shows a typical graph 630 of effective impedance versus interline spacing which can be produced in a workstation window by the invention. The vertical scale 632 shows effective impedance and the horizontal scale 634 shows interline spacing in microns. Lines 636, 638, and 640 represent effective impedance of traces of 40, 50, and 60 microns in width, respectively. Other graphs produced by the invention show crosstalk versus impedance.

7 Database and Miscellaneous Functions

The spreadsheet menu preferably includes a plurality of database function menu options. The DATABASE DELETE function enables deletion of data in a worksheet. The DATABASE CHECK EXISTING MODELS function performs a search of a worksheet and finds all models matching a chosen construction. For example, when the CHECK EXISTING MODELS option is selected, after user entry of layer number, construction technique, and core thickness, the data processor will search the construction database to locate construction models matching the selected criteria.

The WINDOWS option enables the user to rapidly enter a currently active window for the PERFORMANCE, SYNTHESIS, EVALUATION, or SPICE functions. The MENU option has two sub-options to return the user to a main menu and to restart the system of the invention.

8 Example: Clock Tree Design

Table 7 below shows a parameterized SPICE circuit interconnect specification for an exemplary clock tree.

connect subcircuit call statement starting with "X". The subcircuit names being called in each statement, e.g., m2m1py and m2m3sb, start with m2 because the active level is metal 2. The seven interconnect segments X2, X5, X6, X11, X12, X13, and X14, are under dense metal 3 power/ground buses. Therefore, the corresponding called subcircuits have m3 in the middle of their names. The clock skew between nodes %lul and %rur is 0.5 nanosecond. After the trace widths of X11 to X14 are increased to 1.0 µm, the clock skew is decreased to 0.2 nanosecond. If this is still not tolerable. Each SPICE input adjustment takes less than ten seconds. If the interconnect is not parameterized, circuit designers must run time-consuming capacitance simulators several times. Furthermore, manual conversion of the capacitance values into distributed R,C SPICE subcircuits is tedious and error prone.

A SPICE input representing a clock distribution in H-tree is arranged by using the parameterized subcircuits for clock-skew simulations. Table 8 provides a listing of the interconnect portion of the H-tree of this example:

TABLE 7

Clock Tree Interconnect Spec

| X1  | %c1  | %cntr | %c2  | %l1   | %left | %l2   | 0 | m2m1py | (4u 2u 2500u) |
|-----|------|-------|------|-------|-------|-------|---|--------|---------------|
| X2  | %c1  | %cntr | %c2  | %r1   | %rite | %r2   | 0 | m2m3sb | (4u 2u 2500u) |
| X3  | %l1  | %left | %l2  | %lui  | %lu   | %lu2  | 0 | m2sb   | (2u 2u 2350u) |
| X4  | %l1  | %left | %l2  | %ld1  | %ld   | %ld2  | 0 | m2m1py | (2u 2u 1250u) |
| X5  | %r1  | %rite | %r2  | %ru1  | %ru   | %ru2  | 0 | m2m3sb | (2u 2u 1259u) |
| X6  | %r1  | %rite | %r2  | %rd1  | %rd   | %rd2  | 0 | m2m3m1 | (2u 2u 1250u) |
| X7  | %lu1 | %lu   | %lu2 | %lurl | %lur  | %lur2 | 0 | m2m1py | (.8u 1u 1250u) |
| X8  | %lu1 | %lu   | %lu2 | %lull | %lul  | %lul2 | 0 | m2m1py | (.8u 1u 1250u) |
| X9  | %ld1 | %ld   | %ld2 | %ldrl | %ldr  | %ldr2 | 0 | m2m1py | (.8u 1u 1250u) |
| X10 | %ld1 | %ld   | %ld2 | %ld11 | %ld1  | %ld12 | 0 | m2m1py | (.8u 1u 1250u) |
| X11 | %ru1 | %ru   | %ru2 | %rurl | %rur  | %rur2 | 0 | m2m3m1 | (1u 1u 1250u) |
| X12 | %ru1 | %ru   | %ru2 | %rurl | %rul  | %rul2 | 0 | m2m3m1 | (1u 1u 1250u) |
| X13 | %rd1 | %rd   | %rd2 | %rdrl | %rdr  | %rdr2 | 0 | m2m3sb | (1u 1u 1250u) |
| X14 | %rd1 | %rd   | %rd2 | %rdrl | %rd1  | %rd12 | 0 | m2m3sb | (1u 1u 1250u) |

The clock signal is distributed from the center, %cntr, to the eight cells through fourteen metal 2 interconnect segments. Each segment is described by a parameterized inter-

TABLE 8

H-tree Interconnect Portion Spec

| X1 | %c1 | %cntr | %c2 | %l1  | %left | %l2  | 0 | m2m1p_wc  | (4u 1u 2500u) |
|----|-----|-------|-----|------|-------|------|---|-----------|---------------|
| X2 | %c1 | %cntr | %c2 | %r1  | %rite | %r2  | 0 | m2m3s_wc  | (4u 1u 2500u) |
| X3 | %l1 | %left | %l2 | %lu1 | %lu   | %lu2 | 0 | m2sub_wc  | (2u 1u 1250u) |

TABLE 8-continued

| H-tree Interconnect Portion Spec | | | | | | | | | |
|---|---|---|---|---|---|---|---|---|---|
| X4 | %l1 | %left | %l2 | %ld | %ld2 | 0 | m2m1p_wc | (2u 1u 1250u) | |
| X5 | %rl | %rite | %r2 | %rul | %ru | %ru2 | 0 | m2m3s_wc | (2u 1u 1250u) |
| X6 | %rl | %rite | %r2 | %rd1 | %rd | %rd2 | 0 | m2m3m1_wc | (2u 1u 1250u) |
| X7 | %lu1 | %lu | %lu2 | %lurl | %lur | %lur2 | 0 | m2m1p_wc | (.8 1u 1250u) |
| X8 | %lu1 | %lu | %lu2 | %lull | %lul | %lul2 | 0 | m2m1p_wc | (.8 1u 1250u) |
| X9 | %ld1 | %ld | %ld2 | %ldrl | %ldr | %ldr2 | 0 | m2m1p_wc | (.8 1u 1250u) |
| Xa | %ld1 | %ld | %ld2 | %ld11 | %ld1 | %ld12 | 0 | m2m1p_wc | (.8 1u 1250u) |
| Xb | %rul | %ru | %ru2 | %rurl | %rur | %rur2 | 0 | m2m3m1_wc | (1u.8u 1250u) |
| Xc | %rul | %lu | %ru2 | %ru11 | %ru12 | 0 | m2m3m1_wc | (1u.8u 1250u) | |
| Xd | %rd1 | %rd | %rd2 | %rdrl | %rdr | %rdr2 | 0 | m2m3s_wc | (1u.8u 1250u) |
| Xe | %rd1 | %rd | %rd2 | %rd11 | %rd1 | %rd12 | 0 | m2m3s_wc | (1u.8u 1250u) |

The clock signal is transmitted by metal 2 from %cntr to the eight cells. The four cells on the right side are under a dense distribution of metal 3 power/ground buses. Each segment of the H-tree is represented by a subcircuit starting with X. Each subcircuit consists of three lines. The center line represents the clock line for worst-case design. So seven nodes are needed for each subcircuit representing three inputs, three outputs and the ground node.

At first, the trace width of Xb to Xe subcircuits is 0.8 µm, the same as that of X7 to Xa. Since the metal 3 affects the interconnect capacitance and it is primarily on the right-hand size, it causes the symmetric H-tree to have 0.5 nanosecond clock skew. This is done by comparing the delay of %lul with that of %rur. When the trace width of Xb to Xe is increased to 1.0 µm, the skew is decreased to 0.2 nanosecond. The SPICE input can be adjusted in this way until the clock skew is tolerable. Each SPICE input change takes less than ten seconds. If the SPICE deck is not parameterized, VLSI designers have to do 2-D/3-D simulations for times to come up with a new SPICE deck. It takes at least two hours to make one trace width change since the 3-D capacitance simulation of each of the four subcircuits needs at least fifteen minutes. The arrangement of the new simulated capacitance into SPICE deck is tedious and takes about an hour.

9 Example: Signal Communication Optimization

Figure 5:
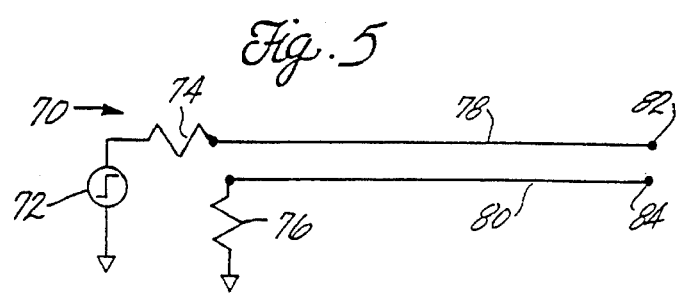
FIG. 5 is a schematic diagram of an exemplary stripline interconnect.

A simplified chip-to-chip signal communication optimization problem demonstrates how the invention helps designers analyze and optimize the interconnect design. In this example, shown in FIG. 5, a signal 72 transmits from an output driver pad to a receiver pad 82 through a multi-line transmission line 78, 80 on an MCM, ignoring solder bumps required between the chips and the MCM. To further simplify the example, the output driver signal 72 is represented by a single low-to-high pulse with 0.2 ns risetime and 40 Ω source resistance. The receiver is assumed to have a high input impedance. The distance between driver and receiver is required to be 8 cm on a MCM. Interconnect choices include stripline or microstrip coupler configuration on several MCMs with different dielectric thicknesses and with or without coatings. The goal is to achieve minimum delay and crosstalk possible and no more than 1 ns delay and 100 mV/V crosstalk.

To use the invention to optimize the design in this case, first, a user runs batch-mode simulations for possible interconnect design configurations. Several construction choices for the MCMs are reviewed from the list in Table 1. Three are polyamide and ceramic materials with dielectric constants of 4.0 and 9.0, respectively. Coatings of various thicknesses are available for microstrips. Also, trace width ranges from 10 to 60 µm, and trace spacing ranges from 40 to 500 µm. The result of the batch-mode simulation is the interconnect R,L,C, impedance, propagation delay, and crosstalk information in the database for surface microstrip, buried microstrip outer (with coating), and stripline configurations for various technologies.

Next the designer can enter impedance and noise margin goals in the synthesis worksheet and the invention will return all the choices that satisfy the requirements. The user can then use the evaluation worksheet to do more detailed design by specifying layer assignments for the chosen MCM technology. Arbitrary choices of trace width/spacing, coupling length, and risetime can be specified, and performance information can subsequently be derived.

Thus, the invention helps designers to analyze and optimize interconnect designs in an interactive way. There are other design constraints, such as cost, thermal management, power consumption, and manufacturability, that determine the final choice of a certain technology. For this application example, an open-ended termination coupler has less power consumption than a well-terminated coupler. The cost of 9.0 dielectric material is less than that of 4.0 dielectric material, and the cheaper material may satisfy performance requirements as well. Microstrip with coating is more manufacturable than strip-lines. It would be difficult to know all the constraints up front before exploring possible alternatives. Since the example has a driver with 0.2 ns risetime and 40 Ω source resistance, an open-ended termination microstrip (with coating) coupler with length of 8 cm is used on a 4.0 dielectric material with T/W=40 µm, T\S=60 µm, and dielectric thickness of 20 µm. For this choice, the final performance result are 0.54 ns delay, and 31 and 61 mV/V reduced noise margin due to crosstalk and reflection for near and far ends, respectively.

The invention database can also be used not only for pre-layout system-level cost-performance analysis but also for schematic capturing and post-layout parasitic circuit extraction. However, both the database format and the layout extraction methods for the IC/MCM/PCB tools must be modified before the interconnect performance extraction routines and database can be integrated and used.

10 Conclusions and Further Technical References

Thus, this invention provides an interconnect modeling system with many significant advantages. The invention improves the productivity of VLSI designers through efficient SPICE deck generations for interconnect designs. The invention allows VLSI designers to specify accurate interconnect models as easy as transistor models without any 2-D/3-D simulations. Existing SPICE simulator software is used unmodified. The invention isolates the chip designer from the details of SMI geometry and process variations. Errors which are commonly found during manual SPICE deck generations are reduced significantly. Submicron VLSI circuits can be easily optimized by using the non-linear multi-variable optimizer and SPICE since both the transistors and the interconnects are parameterized.

One of ordinary skill in the an will recognize that this invention could easily be used for interconnect modeling of VLSI chips, multi-chip modules, hybrid packaging, and printed circuit boards. The invention provides immediate results to the user and the average execution times of the three functions in an HP/Apollo 720 workstation are within 1 second while 2-D/3-D ad hoc simulations take about 20–1000 seconds. Therefore, the time required for an embodiment of the invention to calculate tens to hundreds of data points for all the user-specified models for a construction is much less than the time needed for 2-D/3-D ad-hoc simulations, which provide a single data point for a specified geometry.

Further technical background relating to the technology disclosed herein may be found in the following publications: [1] IPC, *Design Guidelines for Electronic Packaging Utilizing High-speed Techniques, IPC-D-317 Report*, American National Standards Institute, 1991.; [2] T. Sakurai et al., "Simple Formulas for Two- and Three-Dimensional Capacitances," *IEEE Trans. Electron Devices*, pp. 183–185, Feb 1983.; [3] Kit Chain, et al., *Computer-Aided Design and VLSI Device Development*, 2nd Edition, Lower Academic Publishers, Norwell, Mass., pp. 348–351, 1988; [4] N. P. van der Meijs, et al, "An Efficient Finite Element Method for Submicron IC Capacitance Extraction," *26th ACM/IEEE Design Automation Conference*, pp. 678–681, June 1989; [5] Al Barber, and Ken Lee, "Modeling and Analysis of High Speed VLSI Interconnects for Digital Applications," *HP Labs Report HPL*-02-03, January 1992; [6] Vivek Raghavan and Ron Rohrer, "A New Nonlinear Driver Model for Interconnect Analysis," *28th ACM/IEEE Design Automation Conference*, pp. 561–566, June 1991; [7] Olgierd A. Palusinski et al, "Modeling of Performance-Related Design Trade-offs in Multiple-Chip Assemblies," *Proceedings of IEEE/CHMT IEMT Symposium*, pp. 333–336, March 1991; [8] Larry L. Moresco, "Electronic System Packaging: The Search for Manufacturing the Optimum in a Sea of Constraints," *IEEE Trans. Comp., Hybrids, Manuf. Technol.*, vol. 11, pp. 494–508, September 1990; [9] Keh-Jeng Chang, Soo-Young Oh, and Ken Lee, "HIVE: An Efficient Interconnect Capacitance Extractor to Support submicron Multilevel Interconnect Designs," Proceedings of ICCAD, Nov. 1991; [10] TMA, Inc., *TMA Raphael User's Manual*, Oct. 1991; [11] H. B. Bakoglu, *Circuits, Interconnections, and Packaging for VLSI*, Addison-Wesley, Reading, Mass., 1990; [12] Feller, A., et al., "Crosstalk and Reflections in High-speed Digital Systems," *Proceedings of Fall Joint Computer Conference*, 1965; [13] J. Buchanan, *BiCMOS/CMOS Systems Design*, McGraw-Hill, Inc., 1991; [14] Peter A. Sandborn, "A Software Tool for Technology Trade-off Evaluation in Multichip Packaging," *IEEE/CHMT IEMT Symposium*, pp. 337–340, 1991; [15] Informix Software, Inc., *Wingz Reference Manual*, 1991; [16] L. Barford, F. Frayman, S. Jefferson, and D. Kuokka, "Parametric Design Assistant and its Application to PCB Construction," HP DTC, May 1991; [17] W. H. Chang, "Analytical IC Metal-Line Capacitance Formulas," *IEEE Trans. Microwave Theory and Technique*, pp. 608–611, Sep. 1976; [18] J.-H. Chern, et al., "Multilevel Metal Capacitance Models for CAD Design Syntheses Systems," *IEEE Electron Device Letters*, vol. EDL-33, pp. 32–34, Jan 1992; [19] Kit Chain, et al, "CMOS 14/BiCMOS 14 Process and Performance," *Proceedings of HP DTC*, pp. 429–436, May 1991; [20] H. Bakoglu, *Circuits, Interconnects, and Packaging of VLSI*, Addison-Wesley, Reading, pp. 429–436, May 1991; and [21] Rick Walker, et al., "Circuit Optimization Using the Simplex Algorithm," *Proceedings of HP DTC*, pp. 390–397, May 1989.

What is claimed is:

1. A computer-aided method of designing semiconductor interconnect layouts, the method comprising the steps of:

(a) generating, by computer means, numerical capacitance values characteristic of a plurality of predefined interconnect geometries of semiconductor circuits;

(b) storing the generated numerical capacitance values and physical descriptions of the predefined interconnect geometries in an electronic database;

(c) defining an electrical performance criterion for a desired semiconductor circuit;

(d) designing an interconnect layout for the desired semiconductor circuit;

(e) selecting from the electronic database, by computer means, interconnect geometries which are more similar to the designed interconnect layout than others of the interconnect geometries;

(f) interpolating, by computer means, from the selected interconnect geometries and their characteristic numerical capacitance values to obtain numerical capacitance values characteristic of the designed interconnect layout; and (g) determining, by computer means, whether the electrical performance criterion can be met by the designed interconnect layout having the interpolated characteristic numerical capacitance values.

2. A method as in claim 1 wherein the step of defining an electrical performance criterion comprises displaying and receiving data in a computerized synthesis setup worksheet comprising a plurality of synthesis cells organized in a matrix of rows and columns, the synthesis cells enabling a user to input maximum and minimum acceptable values for at least one parameter chosen from the group of trace width, trace spacing, impedance, signal propagation delay, noise margin, and crosstalk.

3. A method as in claim 1 wherein the step of designing an interconnect layout comprises displaying and receiving data in a computerized evaluation setup worksheet, the evaluation setup worksheet having a plurality of evaluation cells organized in a matrix of rows and columns, each row corresponding to a layer of the designed interconnect layout, the evaluation cells enabling a user to input layer assignments of one or more of said layers.

4. A method as in claim 1 wherein the interpolating step further comprises writing a file of SPICE subcircuit data corresponding to the designed interconnect layout.

5. A method as in claim 4 wherein the interpolating step further comprises displaying and receiving data in a computerized SPICE setup worksheet, the SPICE setup worksheet having a plurality of spreadsheet cells organized as a matrix of rows and columns, each row corresponding to a trace of the designed interconnect layout, one of the columns corresponding with driving signal data and another of the columns corresponding with characteristic impedance.

6. A method as in claim 1 wherein the step of determining whether the electrical performance criterion can be met comprises displaying at least one x-y graph of an electrical characteristic versus a physical parameter of the designed interconnect layout.

7. A method as in claim 6 wherein the graphed electrical characteristic is chosen from the group of capacitance and effective impedance and the graphed physical parameter is chosen from the group of interconnect line width and interconnect line spacing.

8. A method as in claim 1 wherein, in the step of generating numerical capacitance values, the plurality of predefined interconnect geometries includes a first plurality of predefined interconnect geometries having conductors of a first predefined line width and a second plurality of predefined interconnect geometries having conductors of a second predefined line width, the conductors in one of the first plurality of predefined geometries being separated by a first predefined line spacing and the conductors in another of the first plurality of predefined geometries being separated by a second predefined line spacing, and the conductors in one of the second plurality of predefined geometries being separated by said first predefined line spacing and the conductors in another of the second plurality of predefined geometries being separated by said second predefined line spacing.

9. A method as in claim 8 wherein computing capacitance data for a line width comprises using polynomials to model capacitance as a function of said predefined line spacings.

10. A method as in claim 9 wherein computing capacitance data comprises interpolating to obtain capacitance data respecting a third predefined line width and capacitance data respecting a third predefined line spacing.

\* \* \* \* \*